United States Patent [19]
Aoki et al.

[11] Patent Number: 5,581,874
[45] Date of Patent: Dec. 10, 1996

[54] METHOD OF FORMING A BONDING PORTION

[75] Inventors: Makoto Aoki; Mitsuaki Komino; Masayuki Kitamura, all of Tokyo, Japan

[73] Assignee: Tokyo Electron Limited, Tokyo, Japan

[21] Appl. No.: 410,736

[22] Filed: Mar. 27, 1995

[30] Foreign Application Priority Data

Mar. 28, 1994 [JP] Japan .................................. 6-080997
Mar. 31, 1994 [JP] Japan .................................. 6-085573

[51] Int. Cl.$^6$ ................................................ H01R 43/00
[52] U.S. Cl. .................................. 29/825; 29/58; 269/8; 279/128; 361/234
[58] Field of Search ............................... 361/234; 29/825, 29/458; 269/8; 279/128

[56] References Cited

U.S. PATENT DOCUMENTS

| | | | |
|---|---|---|---|
| 4,384,918 | 3/1983 | Abe | 361/234 X |
| 4,645,218 | 2/1987 | Ooshio et al. | |
| 5,055,964 | 10/1991 | Logan et al. | 361/234 |
| 5,099,571 | 3/1992 | Logan et al. | 29/885 X |
| 5,179,498 | 1/1993 | Hongoh | 361/234 |
| 5,213,349 | 5/1993 | Elliott | 361/234 X |
| 5,255,153 | 10/1993 | Nozawa et al. | 361/234 |
| 5,452,510 | 9/1995 | Barnes et al. | 29/825 |
| 5,463,525 | 10/1995 | Barnes et al. | 361/234 |

FOREIGN PATENT DOCUMENTS

| | | |
|---|---|---|
| 63-55939 | 3/1988 | Japan . |
| 63-192867 | 8/1988 | Japan . |
| 63-235463 | 9/1988 | Japan . |
| 273981 | 3/1990 | Japan . |
| 4285173 | 10/1992 | Japan . |

*Primary Examiner*—Carl J. Arbes
*Attorney, Agent, or Firm*—Oblon, Spivak, McClelland, Maier & Neustadt, P.C.

[57] ABSTRACT

A process apparatus comprises a process chamber containing a semiconductor wafer, a gas being able to be supplied to and exhausted from the process chamber, a support table for supporting an object to be processed, which is contained in the process chamber, a gas supply system for supplying the gas into the process chamber, and a gas exhaust system for exhausting the gas from the process chamber. An inner wall of the process chamber and the support table are formed of an aluminum-based material, and the surfaces of these are brought into contact with a fluorine-containing gas, thereby coating the surfaces with $AlF_3$.

26 Claims, 4 Drawing Sheets

METHOD OF FORMING A BONDING PORTION

BACKGROUND OF THE INVENTION

1. Field of the Invention

The present invention relates to a process apparatus having coated aluminum-based members, a method for coating aluminum members, and a method of forming a bonding portion.

2. Description of the Related Art

In a CVD apparatus used for forming an insulating film or a thin silicon film on a semiconductor wafer surface, a support table is provided within an airtightly constituted process chamber and a semiconductor wafer to be processed is placed on the support table. The process chamber is evacuated to, e.g. about $10^{-6}$ Torr, a predetermined process gas is introduced into the process chamber, and a predetermined thin film is formed on the semiconductor wafer.

A heating apparatus such as a heater may be provided, in some cases, below the support table. The heating apparatus is supplied with a power from, e.g. an AC power supply to heat the wafer on the support table up to a predetermined temperature.

The surfaces of the support table provided within the process chamber of the CVD apparatus, the inner walls of the process chamber, etc. are generally formed of an aluminum-based material subjected to alumite treatment (anode oxidation treatment).

If the thin film is formed by the CVD apparatus on the wafer or the object to be processed, as mentioned above, a reaction product adheres to the surfaces of the support table, the inner walls of the process chamber, etc. at each time of formation.

Since the process chamber requires a very clean internal atmosphere, a cleaning gas is introduced into the process chamber to remove the reaction product each time a predetermined number of times of the process have been completed. As this kind of cleaning gas, attention is paid to $ClF_3$ and $NF_3$ gases which are excellent in removing reaction products.

However, since the $ClF_3$ and $NF_3$ gases have very high reactivity, the inner walls of the process chamber and the support table themselves are etched. The lifetime of these members are shortened and, in some cases, the process is deteriorated.

On the other hand, there is, for example, an etching process apparatus as another process apparatus for processing a semiconductor wafer in a semiconductor manufacturing step. In this etching apparatus, a support table functioning as a lower electrode is situated within a process chamber serving as an airtight chamber with a reducible pressure. A semiconductor wafer is brought into the process chamber from an opening formed in a side wall of the process chamber via an opening/closing means, e.g. a gate valve, and is placed on the support table. A RF supply is connected to the support table via a blocking capacitor. An upper electrode is provided so as to face the support table functioning as lower electrode. A gas introducing pipe for introducing a process gas into the process chamber is connected to the upper electrode. That surface of the upper electrode, which faces the support table, is provided with small holes. The process gas is guided towards the semiconductor wafer via the gas supply pipe and small holes.

The upper electrode is electrically grounded. When the RF power supply is turned on, a RF power is applied to the support table. Thereby, an electric field is generated, and the process gas is made into a plasma by the electric field.

The upper electrode comprises a plurality of electrically conductive members, for example, aluminum-based top wall, side walls and bottom wall. The surfaces of these members are subjected to alumite treatment and insulating layers are formed thereon. In order to prevent abnormal electric discharge, these members are electrically conductively connected to have an equal potential. In order to connect these members, the bottom wall is provided with a recess for bonding with the side walls.

However, the surface of the bottom wall is subjected to alumite treatment, as described above, and the insulating layer is formed thereon. In order to form the recess, the base material or aluminum is exposed directly by a machining process. Of course, the alumite layers on the contact faces of the side walls, which come into contact with the recess, are removed, and the base material or aluminum is exposed. Thus, electric conductivity between the side walls and the bottom wall is attained, and these members are set at a predetermined potential. These side walls and bottom wall are fixed and coupled by means of, for example, bolts.

In this etching apparatus, however, the plasma is generated within the process chamber. Thus, the exposed aluminum portion of the recess in the bottom wall, which is other than the contact portions with the side walls, is etched by an active species, e.g. ions, in the plasma. Thus, etched matter is dispersed as particles within the process chamber. If the particles adhere to the object to be processed, the yield of processed objects decreases.

Moreover, in many kinds of semiconductor process apparatuses other than the etching apparatus, many kinds of corrosive gases, e.g. chlorine-based gases, are generally used. Such gases corrode the exposed aluminum portion and corroded portion is dispersed as particles within the process chamber.

The corrosion occurs not only at the exposed aluminum portion but also at the contact portion between the bottom wall and side walls, and electric conductivity at the corroded portions becomes unstable. If the corrosion further processes, the electric conductivity is lost. As a result, a potential difference occurs among the members, and an abnormal electric discharge occurs in an apparatus which generates a plasma.

If such an abnormal electric discharge occurs, particles will occur and moreover impedance matching with the high-frequency power supply will be lost. If the impedance matching is lost, the supply of RF power becomes unstable. If objects to be processed are processed in this state, the yield of processed objects will decrease.

SUMMARY OF THE INVENTION

The present invention has been made in consideration of the above circumstances, and an object of the invention is to provide a process apparatus having coated aluminum-based members such as a support table and inner walls of a process chamber, which are not corroded by active gases such as $ClF_3$ and $NF_3$ gases supplied into the process chamber of the process apparatus and used as cleaning gases.

Another object of the invention is to provide a method for coating aluminum members, in which a highly anticorrosive coating is formed on aluminum-based members within a process chamber of a process apparatus.

Still another object of the invention is to provide a method of forming a bonding portion, in which occurrence of particles from a bonding portion among members requiring electric conductivity within a plasma atmosphere can be prevented and high anticorrosiveness of the bonding portion can be maintained.

According to a first aspect of the present invention, there is provided a process apparatus comprising:

a process chamber containing an object to be processed, a gas being able to be supplied to and exhausted from the process chamber;

members, provided within the process chamber, for use in processing the object;

a gas supply system for supplying the gas into the process chamber; and a gas exhaust system for exhausting the gas from the process chamber, wherein an inner wall of the process chamber and/or one or more of the members, which are in contact with an atmosphere, is formed of an aluminum-based material, and a surface of the inner wall of the process chamber and/or a surface of the member or members in contact with the internal atmosphere has a fluorine-containing coating layer.

According to a second aspect of the invention, there is provided a process apparatus comprising:

a process chamber containing an object to be processed, a gas being able to be supplied to and exhausted from the process chamber;

members, provided within the process chamber, for use in processing the object;

a gas supply system for supplying the gas into the process chamber; and a gas exhaust system for exhausting the gas from the process chamber, wherein an inner wall of the process chamber and/or one or more of the members, which are in contact with an atmosphere, is formed of an aluminum-based material, and a surface of the inner wall of the process chamber and/or a surface of the member or members in contact with the internal atmosphere is brought into contact with a fluorine-containing gas, thereby coating the surface with $AlF_3$.

According to a third aspect of the invention, there is provided a method of coating an aluminum-based member, comprising the steps of:

inserting an aluminum-based member to be coated into a chamber; and supplying a fluorine-containing gas into the chamber in a state in which the inside of the chamber is kept at a predetermined temperature, wherein the aluminum-based member and the fluorine-containing gas are reacted to form $AlF_3$ on a surface of the member.

According to a fourth aspect of the invention, there is provided a method of forming a bonding portion, comprising the steps of:

forming a projection at a surface bonding portion of a conductive member;

forming an insulating layer on at least a surface of the conductive member, which has the projection;

removing a part of the insulating layer on the surface of the projection; and bonding a member to be bonded to the surface of the projection, from which the part of the insulating layer is removed.

According to a fifth aspect of the invention, there is provided a method of forming a bonding portion, comprising the steps of:

forming a projection on a surface of a conductive member;

forming an insulating layer on the surface of the member, the insulating layer having a thickness to cover the projection; and polishing the insulating layer and the projection so that at least the surface of the projection is exposed, and mirror-surface polishing a bonding surface of the member.

According to a sixth aspect of the invention, there is provided a method of bonding members, thereby to make structural members of a process apparatus electrically conductive, the process apparatus processing an object to be processed in a reduced-pressure atmosphere, the method comprising the steps of:

forming a projection on a bonding portion of at least one of the members;

forming an insulating layer on bonding surfaces of the members;

removing the insulating layer on the surface of the projection; and putting one of the members to be bonded into contact with the surface of the projection exposed in the preceding step.

According to a seventh aspect of the invention, there is provided a method of bonding members, thereby to make structural members of a process apparatus electrically conductive, the process apparatus processing an object in a reduced-pressure atmosphere, the method comprising the steps of:

forming a projection on a bonding surface of each of the members;

forming an insulating layer on the bonding surface of each of the members, the insulating layer having a thickness to cover the projection;

polishing the insulating layer to a surface of the projection, polishing simultaneously the insulating layer and the projection, and mirror-surface finishing the bonding surfaces of the members; and putting the projections of the members in contact.

DETAILED DESCRIPTION OF THE PREFERRED EMBODIMENTS

Preferred modes of the present invention will now be described.

Figure 1:
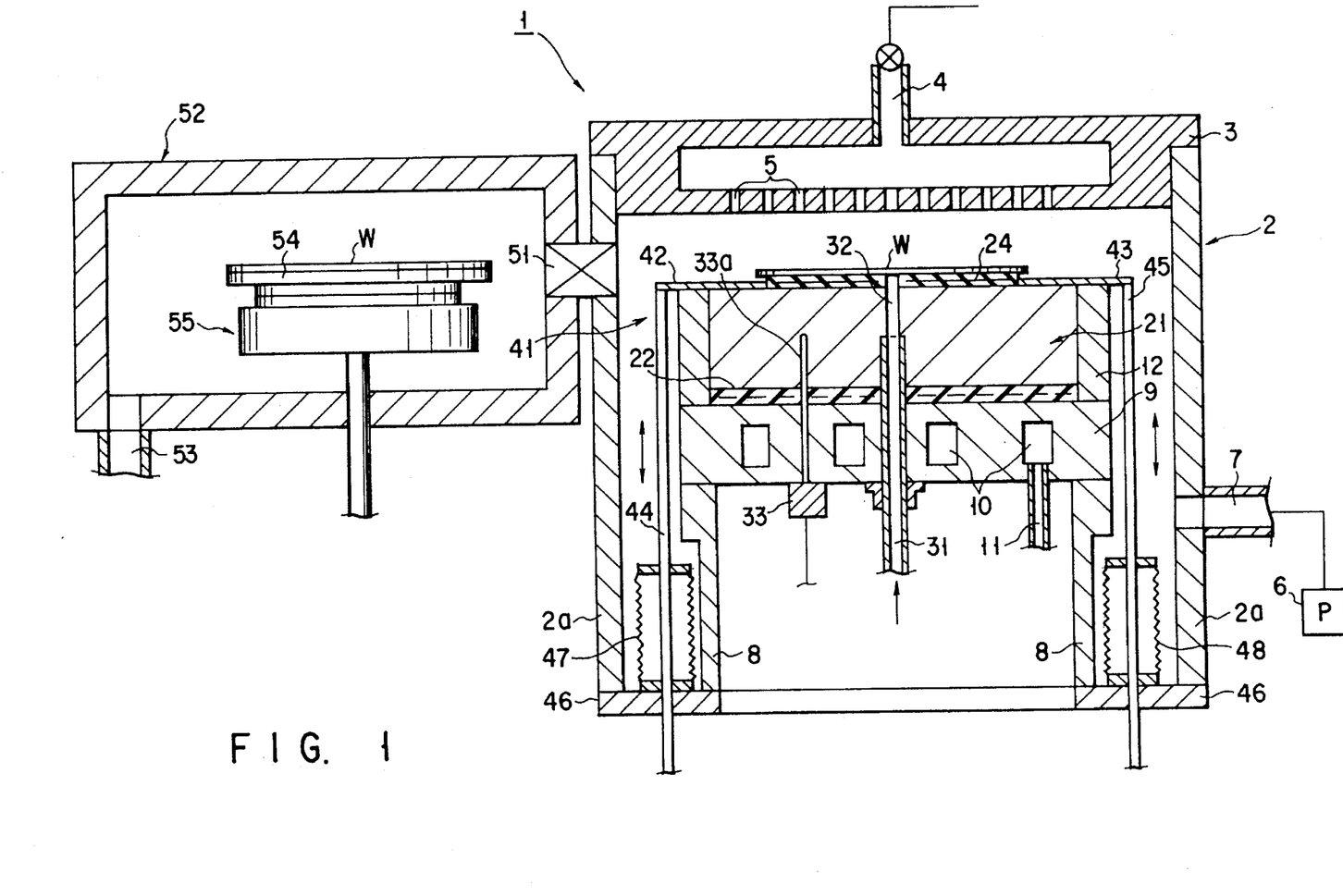
FIG. 1 is a cross-sectional view schematically showing a multi-chamber type CVD apparatus according to a first mode of the present invention.

FIG. 1 is a cross-sectional view schematically showing a multi-chamber type CVD apparatus according to a first mode of the present invention. The CVD apparatus 1 has a substantially cylindrical process chamber 2 with a pressure-reducible internal space.

A bottom portion of the process chamber 2 is constituted by a bottom plate 9 supported by a substantially cylindrical support member 8. A support table 21 for supporting a semiconductor wafer W is provided above the bottom plate 9 with a heating apparatus 22 interposed.

A substantially hollow shower head 3 is airtightly provided on a top surface of the process chamber 2. An upper portion of the shower head 3 is connected to a process gas introducing pipe 4. A lower surface of the shower head 3, i.e. a surface opposed to the support table 21, is provided with many injecting ports 5. A process gas introduced from the process gas introducing pipe 4, e.g. a mixture gas of $SiH_4$ (silane) gas and $H_2$ gas, is uniformly injected towards the support table 21 within the process chamber 2 via the many injected ports 5 from the hollow portion of the shower head 3.

On the other hand, an exhaust pipe 7 communicating with an exhaust apparatus 6 such as a vacuum pump is provided in the vicinity of the bottom of the process chamber 2. The exhaust apparatus 6 is operated, thereby reducing the pressure within the process chamber 2 to, e.g. $10^{-6}$ Torr.

A cooling water reservoir 10 is provided within the bottom plate 9. Cooling water supplied via a cooling water pipe 11 is circulated in the cooling water reservoir 10.

On the other hand, the heating apparatus 22 and support table 21 are surrounded by a heat insulating wall 12. The heat insulating wall 12 is finished to have a mirror surface and has a high reflectance so as to reflect radiation heat from the heating apparatus 22 and the side surface of the support table 21 heated by the heating apparatus 22. Thus, heat insulation from the surrounding can be effected.

Figure 2:
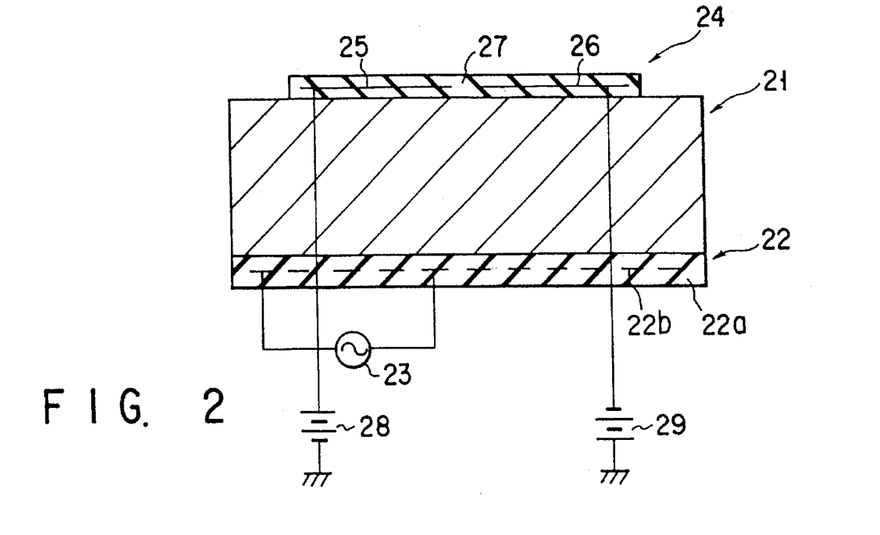
FIG. 2 is a cross-sectional view schematically showing a wafer support table of the multi-chamber type CVD apparatus according to the first mode of the invention.

As is shown in FIG. 2, the heating apparatus 22 is formed such that a substantially strip-like heating member 22b is formed in a substantially spiral shape within an insulating member 22a at a desirable interval, or formed in another predetermined pattern. The heating apparatus 22 is heated up to a predetermined temperature, e.g. 400° C. to 2000° C., by a power supplied from an AC power supply 23 provided outside the process chamber 2. With this heat, the wafer W or the object to be processed can be maintained at a predetermined temperature, e.g. 800° C.

Figure 3:
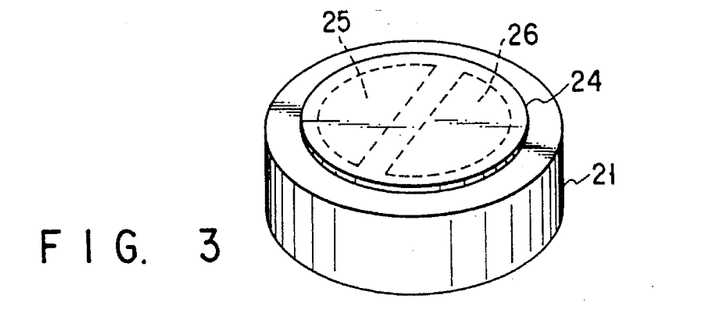
FIG. 3 is a perspective view showing the wafer support table and an electrostatic chuck of the multichamber type CVD apparatus according to the first mode of the invention.

An electrostatic chuck 24 for attracting and holding the wafer W or the object to be processed is provided on the upper surface of the support table 21. As is shown in FIG. 3, the electrostatic chuck 24 has such a structure that the upper and lower parts of semicircular thin electrode plates 25 and 26 are covered with insulator 27. As is shown in FIG. 2, the electrode plates 25 and 26 are individually connected to DC voltage power supplies 28 and 29 which have mutually opposite polarities and are situated outside the process chamber 2. Thus, a so-called bipolar electrostatic chuck is constituted. If a DC voltage of, e.g. 2 kV is applied to the electrode plates 25 and 26 from the DC high-voltage power supplies 28 and 29, the wafer W placed on the upper surface (support surface) of the electrostatic chuck 24 is electrostatically attracted and held on the upper surface of the electrostatic chuck 24 by a Coulomb force generated at this time.

Furthermore, as shown in FIG. 1, a flow path 32 communicating with a heat transmission medium supply pipe 31 penetrating the bottom plate 9 and heating apparatus 22 is formed at a central portion of the support table 21. A heat transmission medium such as He gas supplied through the heat transmission medium supply pipe 31 from the outside of the process chamber 2 is supplied via the flow path 32 to the bottom surface of the wafer W placed on the support surface of the electrostatic chuck 24.

A sensor portion 33a of a temperature sensor 33 is situated within the support table 21 and senses the temperature of the inside of the support table 21 at any time. On the basis of a signal from the temperature sensor 33, the power, which is supplied from the AC power supply 23 for supplying power to the heating apparatus 22, etc. is controlled. Thereby, the temperature of the support surface of the support table 21 is controlled at a predetermined temperature.

A lifter 41 for vertically moving the wafer W placed on the support surface of the support table 21 is provided within a substantially annular space defined by an outer peripheral side surface of the heat insulating wall 12, an outer peripheral side surface of the bottom plate 9, an outer peripheral side surface of the support member 8 and an inner periphery of a side wall 2a of the process chamber 2.

An upper part of the lifter 41 comprises a pair of semicircular support members 42 and 43 matching with the curvature of the wafer W and support columns 44 and 45 vertically provided on the lower surfaces of the support members 42 and 43. The wafer W is placed on desirable engaging portions provided on inner peripheral edge portions of the support members 42 and 43.

On the other hand, as shown in FIG. 1, a lower part of the lifter 41 is constituted such that lower end portions of the support columns 44 and 45 penetrate an annular support plate 46, which airtightly closes the bottom region of the substantially annular space, and are connected to a vertical drive mechanism (not shown) such as a motor. By the operation of the vertical drive mechanism, the support columns 44 and 45 are vertically moved, as indicated by an arrow in FIG. 1.

Bellows 47 and 48 are provided at penetration locations of the support plate 46 and support columns 44 and 45 within the process chamber 2. The airtightness of the process chamber 2 is maintained by the bellows 47 and 48.

A load lock chamber 52 constituted airtightly is provided outside the process chamber 2 having the above structure via a gate valve 51. Like the process chamber 2, the load lock chamber 52 can be evacuated via an exhaust pipe 53 provided at a bottom portion thereof to a predetermined reduced pressure level of, e.g. $10^{-6}$ Torr.

A transfer apparatus 55 is provided within the load lock chamber 52. The transfer apparatus 55 has a transfer arm 54 for transferring the wafer W between a cassette in a cassette storage chamber (not shown) adjoining the load lock chamber 52 via a gate valve and the support table 21 within the process chamber 2.

A description will now be given of the materials of the members used in the CVD apparatus 1 having the above structure.

The support table 21, the insulating member 22a of the heating apparatus 22 and the insulating member 27 of the electrostatic chuck 24 are formed of, e.g. the same material. For example, $AlF_3$ is formed on the surface of the support member 21 by a reaction between an oxide of Al, i.e. $Al_2O_3$, and fluorine.

A method of forming $AlF_3$ on the surface of $Al_2O_3$ is described below.

Figure 4:
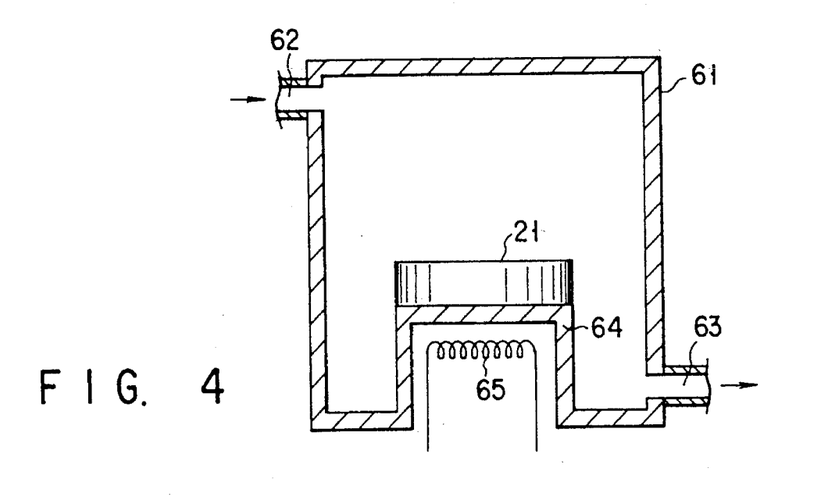
FIG. 4 is a cross-sectional view showing an apparatus for forming $AlF_3$ on a surface of an aluminum member.

As is shown in FIG. 4, a gas supply pipe 62 is provided at an upper part of a chamber 61 formed of a material with high thermal conduction, e.g. stainless steel, and coated with nickel on its inner surface. An exhaust pipe 63 is provided at a lower part of the chamber 61. A process table 64 is formed within the chamber 61. A heating apparatus 65 is situated on a lower surface of the support table 64.

The support table 21 used in the CVD apparatus 1 is placed on the process table 64. The heating apparatus is activated to keep the support table 21 at a predetermined temperature, e.g. 300° C. A fluorine-containing gas, e.g. HF is supplied into the chamber 61 via the gas supply pipe 62 and at the same time a gas is exhausted via the exhaust pipe 63. Then, the following reaction progresses on the surface of the support table 21.

$$Al_2O_3 + 6HF \rightarrow 2AlF_3 + 3H_2O$$

That is, $AlF_3$ is formed on the surface of the support table 21 in accordance with the above reaction.

Since the inner surface of the chamber 61 is coated with nickel, as mentioned above, it has anticorrosion properties to a halogen-based gas, in particular, HF gas and HCl gas, used in the coating process.

In addition, $ClF_3$, which has recently been used as a cleaning gas for a process apparatus such as the aforementioned film forming apparatus, may be used as a coating gas. In this case, the following reaction occurs:

$$2Al_2O_3 + 4ClF_3 \rightarrow 4AlF_3 + 3O_2\uparrow + 2Cl_2\uparrow$$

Thus, $AlF_3$ is formed on the surface of $Al_2O_3$.

Besides, $NF_3$ used as a cleaning gas may be supplied into the chamber 61 in place of the aforementioned $ClF_3$. In this case, the following reaction occurs:

$$2Al_2O_3 + 4NF_3 \rightarrow 4AlF_3 + 3O_2\uparrow + 2N_2\uparrow$$

Thus, $AlF_3$ is formed on the surface of $Al_2O_3$.

By all the same method, $AlF_3$ is formed as a passive state coating on the surfaces of the insulating member 22a of the other heating apparatus 22 and the insulating member 27 of the electrostatic chuck 24.

In order to effectively form $AlF_3$ on the surface of each member by the above reaction, it is necessary to control the amount of the introduced coating gas and the temperature within the chamber in fixed ranges.

The temperature understood from a free energy variation $\Delta G$ of the chemical reactions represented by the above formulae, at which $AlF_3$ is practically produced, is, for example, 200° C. or above when HF is used as a coating gas, 20° C. or above when $ClF_3$ is used, and 200° C. or above when $NF_3$ is used.

Any fluorine-containing gas may be used as a coating gas, only if $AlF_3$ is effectively produced. Other examples are $BF_3$, $B_2F_4$, $CF_4$, $ClF_5$, $N_2F_2$, $N_2F_4$, $PF_3$, $PF_5$, $SF_4$ and $SF_6$.

The operation of the film forming apparatus having the above structure will now be described.

At the time the atmospheric pressure within the process chamber 2 and that within the load lock chamber 52 have been reduced to the same level, the gate valve 51 is opened and the wafer W to be subjected to film formation is transferred to a location above the support table 21 within the process chamber 2 by the transfer arm 54 of the transfer apparatus 55.

The support members 42 and 43 of the lifter 41 are raised at this time, and the wafer W is placed on the engaging portions at the inner peripheral edge portions of the support members 42 and 43. After the wafer W is placed in this manner, the transfer arm 54 is retreated into the load lock chamber 52 and the gate valve 51 is closed.

Thereafter, the support members 42 and 43 of the lifter 41 are lowered and the wafer W is placed on the support surface of the electrostatic chuck 24 of the support table 21. A DC voltage is applied from the high-voltage DC power supplies 28 and 29 to the electrode plates 25 and 26, whereby the wafer W is attracted and held on the support surface by a Coulomb force produced at the time of voltage application.

Subsequently, power is supplied from the AC power supply 23 to the heat generating member 22b of the heating apparatus 22, thereby activating the heating apparatus 22, heating the wafer W up to a predetermined temperature, e.g. 800° C., and introducing the process gas, e.g. $SiH_4$ (silane)+ $H_2$, from the process gas introducing pipe 4 into the process chamber 2. Thus, the process of film formation on the wafer W is begun.

In this manner, the film forming process is performed on the surface of the wafer W or the object to be processed. However, reaction products also adhere to the surfaces of the members within the process chamber 2, in particular, the support table 21, electrostatic chuck 24 and heating apparatus 22 which are heated up to the same level as the wafer W or the object to be processed. If such reaction products are left as they are, the reaction products may become a cause of contamination within the process chamber 2. Thus, it is necessary to clean the inside of the process chamber 2 each time a predetermined number of times of processes have been completed.

In this case, $ClF_3$ or $NF_3$ has recently been used as a cleaning gas. In conventional CVD apparatus, the surface of a support table, an electrostatic chuck and a heating apparatus of a conventional material is corroded by the cleaning gas of $ClF_3$ or $NF_3$, as mentioned above.

However, the $AlF_3$ passive state coating, which is very stable to $ClF_3$ or $NF_3$, is formed on the surfaces of the support table 21, the insulating member 27 on the surface of the electrostatic chuck 24 and the insulating member 27 on the surface of the heating apparatus 22. Thus, such corrosion does not occur.

Specifically, the bond dissociation energy of $AlF_3$ is 665 [kJ/mol], which is much greater than 490 [kJ/mol] of $Al_2O_3$ which is considered a stable substance. Thus, $AlF_3$ is very stable. In addition, since the melting point of $AlF_3$ is 1040° C., $AlF_3$ is very stable at the temperature (800° C.) in the aforementioned film forming process.

Accordingly, the anticorrosion properties of the surfaces of the support table 21, the insulating member 27 on the surface of the electrostatic chuck 24 and the heating apparatus 22 are greatly enhanced, and these surfaces are not corroded by the cleaning gas of $ClF_3$ or $NF_3$.

In the above-mentioned method for forming the stable $AlF_3$ passive state coating on the surface of the aluminum-based material, the surface of $Al_2O_3$ is reacted with fluorine. In another method, the surface of AlN may be reacted with fluorine, or the surface of Al may be reacted with fluorine.

That is, in the case of AlN, like $Al_2O_3$, the object as shown in FIG. 4 is kept at a predetermined temperature (20° C. or above) and $ClF_3$ or $NF_3$ is supplied into the chamber 61.

In the case of the former, the following reaction occurs:

$$2AlN + 2ClF_3 \rightarrow 2AlF_3 + N_2\uparrow + Cl_2\uparrow$$

In the case of the latter, the following reaction occurs:

$$AlN + NF_3 \rightarrow AlF_3 + N_2\uparrow$$

In either case, $AlF_3$ is formed on the surface.

In another case where HF gas is used, the following reaction occurs:

$$AlN + 3HF_3 \rightarrow AlF_3 + NH_3$$

and $AlF_3$ is formed on the surface.

In the case of Al, the object is kept at a predetermined temperature (20° C. or above) and $F_2$ is supplied. Thus, the reaction represented by $$2Al + 3F_2 \rightarrow 2AlF_3$$

occurs and an $AlF_3$ passive state coating is formed on the surface thereof.

The experimental results on the anticorrosion properties in the case where $AlF_3$ was actually formed by the inventors will now be shown.

A sample in which $AlF_3$ is formed on the surface of $Al_2O_3$ and a sample of P-BN (Pyrolytic-Bron Nitride) used as insulating material of a heating apparatus of a conventional CVD apparatus were exposed to a cleaning gas of $ClF_3$ under the same conditions stated below.

Conditions: $ClF_3/N_2 = 700/2800$ sccm was supplied for 120 minutes at 1 Torr and 620° C. The area of each sample is 157 cm².

Table 1 shows the results.

TABLE 1

| Sample | Weight Before Experiment (g) | Weight After Experiment (g) | Difference (g) | Decrease In Volume (cm³) |
|---|---|---|---|---|
| P-BN | 7.77 | 6.22 | 1.55 | 0.70 |
| $Al_2O_3/AlF_3$ | 15.56 | 15.55 | 0.1 | 0.00 |

As shown in the Table, in the case of P-BN, the weight decreased by a large amount of 1.55 g after the experiment, and the volume also decreased by 0.70 cm³. It was confirmed that this sample was corroded by $ClF_3$. By contrast, in the case of the sample in which $AlF_3$ is formed on the surface of $Al_2O_3$, the weight decreased by a small amount of 0.01 g and the decrease in volume was too small to be measured. It was confirmed, accordingly, that the sample in which $AlF_3$ is formed on the surface of $Al_2O_3$ was little corroded and it had very high anticorrosion properties.

In the above examples, the present mode of the invention was applied to a so-called thermal CVD apparatus. The application of the present mode is not limited to this. The present mode is applicable to a plasma CVD apparatus and other semiconductor process apparatuses such as an etching apparatus, an ashing apparatus and a sputtering apparatus.

In view of the aforementioned functions, it is preferable that not only the support table within the process chamber and the inner walls of the process chamber, but also the surfaces of the aluminum-based members constituting the exhaust pipe 7 of the flow path of the exhaust system and the pump 6 of the other exhaust system be similarly coated with $AlF_3$ by the fluorine-based gas treatment.

A second mode of the present invention will now be described.

Figure 5:
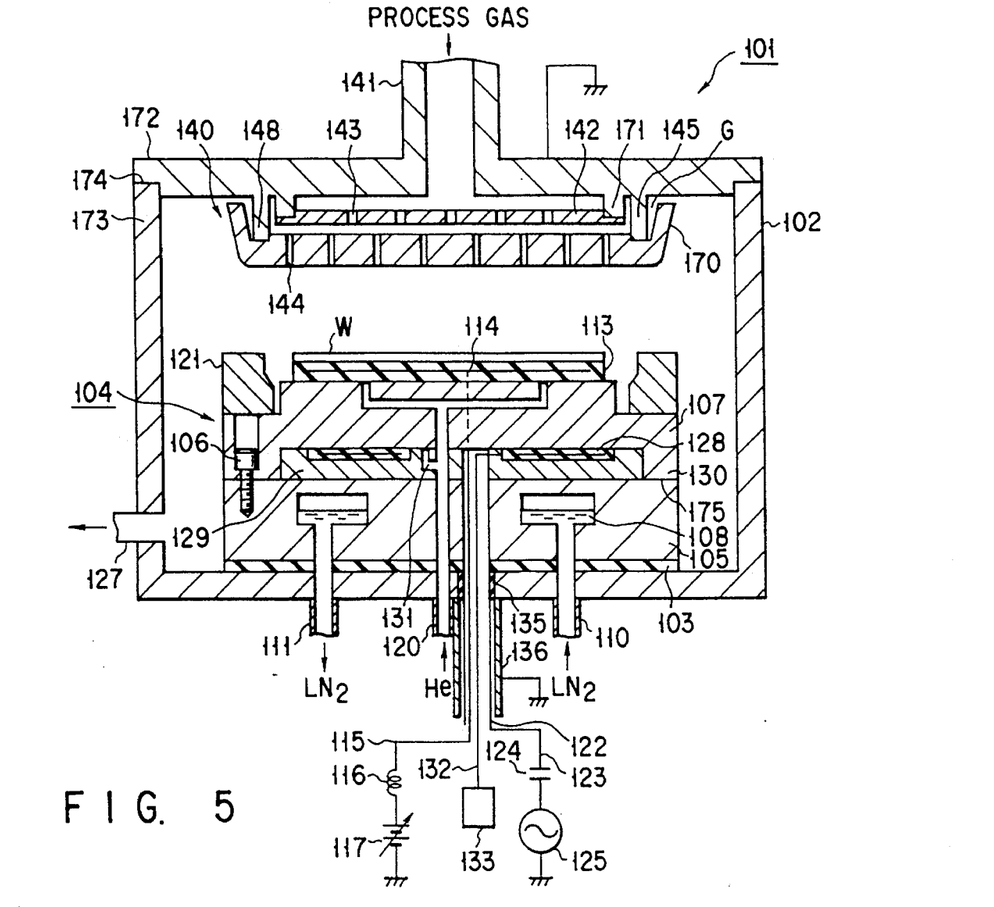
FIG. 5 is a cross-sectional view schematically showing a low-temperature plasma etching apparatus according to a second mode of the invention.

FIG. 5 is a cross-sectional view schematically showing a low-temperature plasma etching apparatus according to a second mode of the present invention. As is shown in this figure, an etching apparatus 101 has a cylindrical (or rectangular) process chamber 102 formed of an electrically conductive material, e.g. aluminum, whose surface is subjected to alumite treatment (anode oxidation treatment). A support table 104 which has substantially cylindrical shape and functions as a lower electrode for supporting an object to be processed, e.g. a semiconductor wafer W is situated on a bottom portion of the container 102 with an insulating plate 103 of ceramic material, etc. interposed. The support table 104 is formed of, e.g. aluminum whose surface is subjected to alumite treatment. Specifically, the support table 104 comprises a cylindrical susceptor 107 and a cylindrical susceptor support table 105. These are fastened by bolts 106. the susceptor 107 can be removed by disengaging the bolts 106. Needless to say, the fastening means is not limited to bolts.

A cooling means, e.g. a cooling jacket 108 is provided within the susceptor support table 105. A refrigerant, e.g. liquid nitrogen is introduced into the jacket 108 through a refrigerant introducing pipe 110. The refrigerant circulates in the jacket 108. A gas formed by evaporation of the liquid nitrogen is exhausted to the outside of the container 102 through the refrigerant exhaust pipe 111. At the same time, the gas is cooled and circulated once again through the refrigerant introducing pipe 110. Accordingly, in the case where liquid nitrogen is used as refrigerant, cold of the liquid nitrogen at −196° C. is supplied to the wafer W from the cooling jacket 108 via the susceptor 107. By the cold, the wafer W can be cooled down to a desired temperature.

The susceptor 107 has a disc-like shape with a projecting upper central portion. An electrostatic chuck 113 is placed on a wafer support portion at the center of the susceptor 107. The area of the electrostatic chuck 113 is substantially equal to that of the wafer W or slightly less than that of the wafer W such that the electrostatic chuck 113 is not exposed to a plasma.

The electrostatic chuck 113 is formed, for example, by sandwiching an electrically conductive film 114 such as a copper foil between two high molecular polyimide films. The conductive film 114 is connected by a voltage supply lead to a variable DC high-voltage supply 117 via a filter 116 for cutting off high frequency waves. Thus, by applying a high voltage to the conductive film 114, the wafer W is attracted and held on the upper surface of the electrostatic chuck 113 by a Coulomb force.

A gas passage 120 is formed to penetrate the susceptor support table 105 and susceptor 107. The gas passage 120 functions to supply a heat transmission gas such as He to the bottom surface of the wafer W, a bonding portion of the susceptor support table 105 and susceptor 107, a bonding portion of members constituting the susceptor 107, etc. The electrostatic chuck 113 is provided with many gas pass holes (not shown) for passing the heat transmission gas.

An annular focus ring 121 is situated at an upper peripheral edge portion of the susceptor 107 so as to surround the wafer W. The focus ring 121 is formed of an insulating material which does not attract reactive ions and constructed to make the reactive ions effectively incident on the internal semiconductor wafer W alone.

A hollow pipe lead 122 formed of a conductor is connected to the susceptor 107 through the susceptor support table 105. The pipe lead 122 is connected via a wire 123 to a blocking capacitor 124 and a plasma generating high-frequency power supply 125 (e.g. 13.56 MHz, 40.68 MHz)

successively. Thus, the susceptor 107 functions as a lower electrode. An exhaust pipe 127 is connected to a lower side wall portion of the process container 102, so that an internal gas within the process container 102 can be exhausted by an exhaust pump (not shown). In addition, a central side wall portion is provided with a gate valve (not shown) through which the wafer is carried in and out.

A temperature control heater 128 is provided under the susceptor between the electrostatic chuck 113 and cooling jacket 108. The heater 128 is formed of a plate-like ceramic heater with a thickness of, e.g. several mm. The heater 128 is completely housed in an upper portion of a heater fixing table 129 fixed on the upper surface of the susceptor support table 105 by means of a bolt (not shown), etc. such that the upper surface of the heater 128 is on the same level as that of the upper surface of the heater fixing table 129. The heater fixing table 129 is formed of a material with good heat conduction, e.g. aluminum. It is desirable to set the size of the heater 128 such that the area of the heater 128 is substantially equal to or more than the area of the wafer. The heater 128 controls the temperature of the wafer W by controlling the transmission of cold to the wafer W from the cooling jacket situated below. The temperature control heater 128 and heater fixing table 129 are provided with through-holes (not shown), etc. for inserting pusher pins, etc.

A containing recess 130 for containing the entire heater fixing table 129 is formed in the lower surface of the susceptor 107. A branch path 131 connected to the gas passage 120 is formed in the heater fixing table, for supplying a heat transmission medium such as He to a boundary portion between the upper surface of the heater 128 and the lower surface of the container recess 130 of the susceptor 107.

A power supply lead 132 is connected to the heater 128, and a power supply 133 is connected to the lead 132. A predetermined power is supplied to the heater 128 from the power supply 133.

All various wires susceptible to plasma generating high-frequency waves, e.g. power supply lead 132 connected to the heater and voltage supply lead 115 connected to the electrostatic chuck 113, are contained within the pipe lead 122 for supplying plasma generating high-frequency power. Thus, an influence of high-frequency noise upon the outside is prevented. An insulator 135 is provided on the pipe lead 122 at a penetration portion of the bottom part of the process container, thus effecting electrical insulation from the container 102.

An electrically grounded shield 136 is provided on the outer periphery of the pipe lead 122 extending to the outside of the container 102, thereby preventing a leak of high-frequency current to the outside.

A grounded upper electrode 140 is provided above the susceptor 107 at a distance of about 3 to 20 mm. A process gas, e.g. an etching gas such as $CF_4$, is supplied to the upper electrode 140 via a gas supply pipe 141. The etching gas is uniformly diffused through small holes 143 of a gas diffusion plate 142 provided between the gas supply pipe 141 and upper electrode 140 and is blown downward to the process space from many small holes 144 formed in the upper electrode 140.

Figure 6:
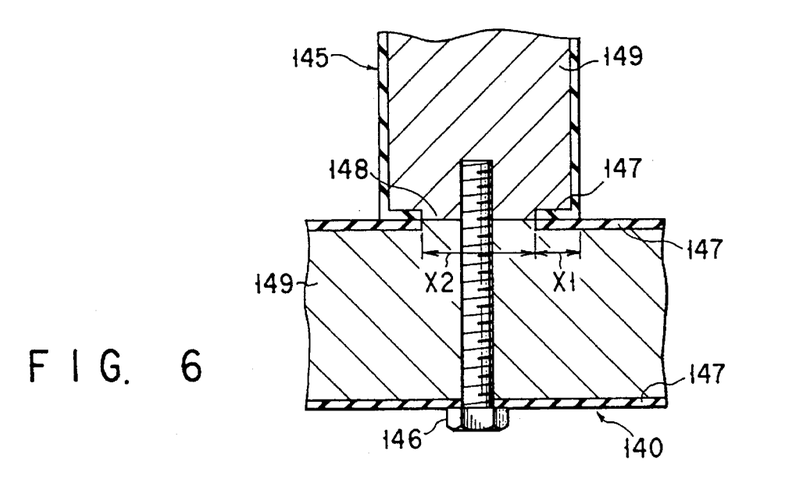
FIG. 6 is an enlarged cross-sectional view of a region of a bonding portion of the low-temperature etching apparatus according to the second mode of the invention.

At a bonding portion between members constituting the upper electrode 140 and process chamber 102, a projection 145 or a member to be bonded, provided on the process chamber 102, is bonded to the upper electrode 140, and these are coupled by coupling means, e.g. a bolt 146, as shown in FIG. 6. Regarding these bonded portions, the conductive members of the projection 145 and upper electrode 140, e.g. surfaces of aluminum 149, are provided with insulating films 147 of, e.g. $Al_2O_3$ for preventing corrosion by plasma sputtering or corrosive gas, for example, by means of alumite treatment (anode oxidation treatment). The insulating films 147 are formed over a predetermined distance $X_1$ (e.g. about 10 mm) from a peripheral edge of the bonding portion 148 between the projection 145 and upper electrode 140. Aluminum or conductive members are exposed over a distance $X_2$ of about 20 mm at a substantially central portion within the peripheral edge. These are put in contact and electrically conductive.

Figure 7A:
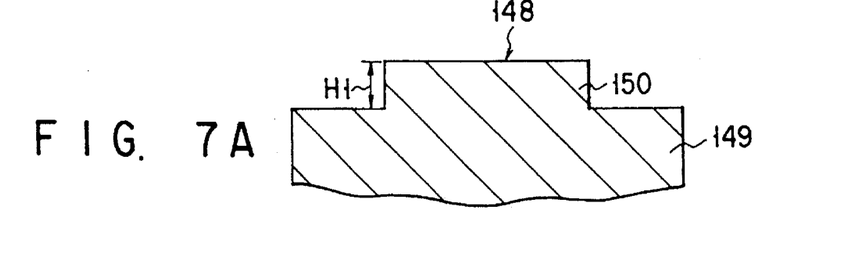
FIGS. 7A to 7C are cross-sectional views illustrating a process of forming the bonding portion.
Figure 7B:
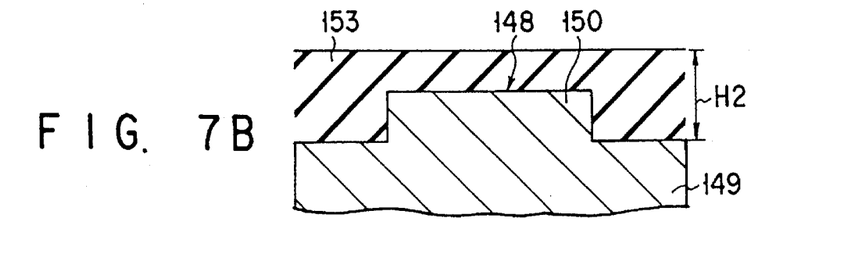
Figure 7C:
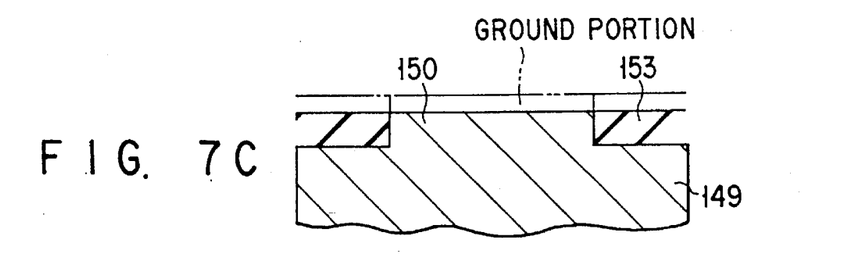

A method of forming the bonding portion 148 will be described specifically.

As is shown in FIG. 7A, a projection 150 is formed on that surface of the conductive member 149, which faces the bonding portion 148, the conductive member 149 being formed of, e.g. aluminum or an aluminum alloy as a base material. The projection 150 is formed by means of, e.g. grinding such that the height $H_1$ thereof is, e.g. in a range of 30 to 200 μm, e.g. about 50 μm. At this time, the flatness of the bonding portion 148, expressed by surface roughness, should desirably be set at about 10 μm or less at Rmax in order to keep the flatness necessary for the subsequent step.

After this step, an insulating layer 153 with a thickness $H_2$ in a range of 31 to 200 μm, e.g. about 70 μm, as shown in FIG. 7B, on the surface of the conductive member 149 so as to cover the projection 150. An example of the insulating layer 153 is $Al_2O_3$ formed by, e.g. alumite treatment (anode oxidation treatment).

As is shown in FIG. 7C, the insulating layer 153 is ground by, e.g. 20 μm or more until at least the surface of the projection 150 appears. Further, the insulating layer 153 and projection 150 are polished so that the bonding portion forming surface of the conductive member 149 becomes a mirror surface with a surface roughness of about 20 μm or less at Rmax. Thus, the bonding portion 148 is formed.

The reason why the projection 150 is formed by, e.g. polishing so that the flatness of the bonding portion 148, expressed by the surface roughness, is about 10 μm or less is as follows. It is difficult to set the surface roughness of the bonding portion forming surface of the conductive member 149 at about 20 μm or less in the mirror surface finishing step, unless the surface finishing of double the precision of the surface roughness is performed.

The reasons why the surface roughness of about 20 μm or less is attained in the mirror surface finishing step are as follows. The surface roughness of about 20 μm or less achieves good fittability as a bonding portion. It is possible to prevent a plasma from entering the bonding portion 148 from the outside of the bonding portion 148 and prevent a plasma from being generated in the bonding portion 148. In addition, it is possible to curb the entering of a corrosive gas, e.g. a chlorine-based gas or fluorine-based gas into the bonding portion 148. Furthermore, the electric bonding portion is provided at a substantially central portion of the bonding portion 148 and the insulating layer 153 is formed on the peripheral portion of the bonding portion. Thus, even if the plasma has entered or the corrosive gas has entered from the peripheral edge of the bonding portion, the plasma or corrosive gas is prevented from reaching the central electric contact portion.

Figure 8:
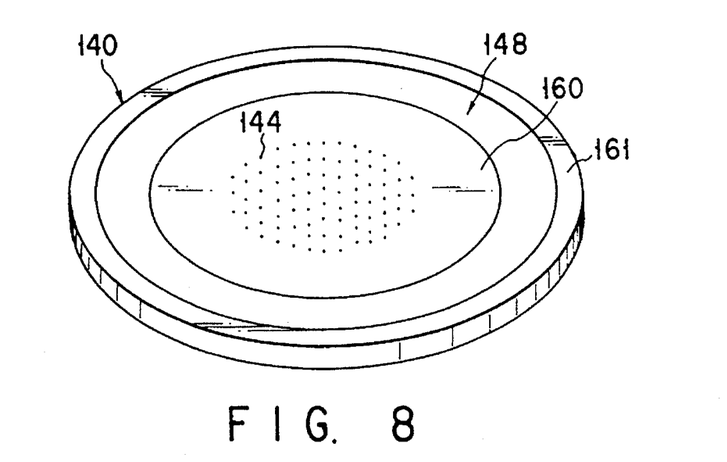
FIG. 8 is a perspective view of an upper electrode of the low-temperature etching apparatus according to the second mode of the invention.

Accordingly, as shown in FIG. 8, the bonding surface side of the upper electrode 140 is formed such that the insulating layer 153 is situated on a central portion 160 provided with small holes 144 and a peripheral portion 161. The bonding portion 148 is situated between the central portion 160 and peripheral portion 161 for permitting electric conduction therebetween. The same treatment is performed on the bonding surface side of the projection 145, shown in FIG. 5, for bonding with the bonding portion 148. As is shown in FIG. 6, the upper electrode 140 and projection 145 are put in contact and fixed by means of the bolt 146.

A peripheral edge portion 170 of the upper electrode 140, as shown in FIG. 5, is bent in a direction away from the plasma generating region, in order to prevent a plasma, a corrosive gas, etc. from entering the bonding portion 148. It is desirable that a gap G between the peripheral edge portion 170, which is bent to prevent a plasma, a corrosive gas, etc. from entering the contact portion 148, and the projection 145 be 5 mm or less. The same treatment is performed on the bonding portion between the gas diffusion plate 142 and a projection 171 formed on the process chamber 102 so that electric conduction with the process chamber 102 is permitted.

Needless to say, the above bonding portion may be formed between other members requiring electric conduction, for example, a bonding portion 174 between a top plate 172 and a side wall plate 173 of the process container 102, as shown. in FIG. 5, a bonding portion 175 between the susceptor 107 and susceptor support table 105, etc.

The operation of the apparatus according to the present mode with the above structure will now be described.

The semiconductor wafer W is transferred from an auxiliary chamber (not shown) with a reduced internal pressure into the process chamber 102, the pressure within which is reduced to a predetermined pressure level, e.g. a pressure level equal to that of the auxiliary chamber or a positive pressure level of about $1 \times 10^{-6}$ to several Torr. The wafer W is placed on the electrostatic chuck 113 provided on the susceptor 107 and attracted and held by the Coulomb force of the electrostatic chuck 113. High-frequency waves are applied via the pipe lead 122 between the upper electrode 140 and lower electrode (susceptor) 107, thereby causing a plasma. At the same time, the process gas is supplied from the side of the upper electrode 140 into the process space. Thus, the plasma etching treatment for the wafer W is started.

In this case, the wafer W is heated at a temperature higher than a predetermined temperature by the heat of the plasma. In order to cool the wafer W, a refrigerant, e.g. liquid nitrogen is flown to the cooling jacket 108 of the susceptor support table 105, and this region is kept at low temperatures of about $-196°$ C. Cold from this region is supplied to the wafer W via the susceptor 107 situated above. Thereby, the wafer W is cooled and kept in a desired low-temperature state. Thus, low-temperature etching is effected on the wafer W.

In addition, the temperature of the wafer W is controlled by controlling the amount of heat generated by the temperature control heater 128 provided between the cooling jacket 108 and the wafer W. Thus, the wafer W is kept at a predetermined temperature, e.g. about $-150°$ C. to $100°$ C. Besides, the temperature of the wafer can be raised above normal temperature, e.g. up to $100°$ C., by controlling the amount of generated heat of the heater 128 or the flow rate of the refrigerant within the jacket 108.

In the present mode, the bonding surfaces of members requiring electric conduction are designed such that the electrical bonding portion 148 is formed at the substantially central portion of the bonding surfaces and insulating layers 153 are formed on the peripheral portions of the bonding portion, as described above. Thus, at the time of performing the plasma etching process, the plasma is prevented from entering the bonding portion 148, i.e. the internal aluminum base material, from the outside of the bonding portion 148, and the plasma is prevented from being generated in the bonding portion 148. Furthermore, the entering of a corrosive gas, e.g. a chlorine-based gas or fluorine-based gas into the bonding portion 148 can be curbed. Accordingly, the bonding portion 148 can be protected against a plasma damage or corrosion. It is possible, therefore, to prevent matters sputtered from the bonding portion by plasma or corroded matters from floating within the process chamber 102 as particles. Since the floating of the particles can be curbed, the adherence of the particles to the object to be processed, etc. can be prevented and a decrease in yield of processed objects can be curbed.

Since the electrically conductive bonding portion is not corroded or sputtered, the stability of impedance in electrical conduction can be maintained. In particular, in the plasma process apparatus, the impedance matching of the RF power supply can be stabilized, the variation in impedance can be curbed and the objects can be processed with the same power or same phase. Therefore, the non-uniformity in processing of objects can be drastically reduced. In this respect, too, the yield of processed objects can be increased.

This second mode is applied to the bonding portion of the upper electrode of the low-temperature plasma etching apparatus. However, as mentioned above, this mode is applicable to any type of apparatus having a bonding portion of members requiring electrical conduction. The apparatus to which this mode is applied is not limited to the etching apparatus. This mode is also applicable to a probet apparatus for testing electrical characteristics of, e.g. a wafer and an LCD at low temperatures, a CVD apparatus, an electronic microscope for observing samples, etc. The material of the insulating layer is not limited to $Al_2O_3$. For example, $AlF_3$ used in the first mode can be used. Since $AlF_3$ is very stable to a fluorine-based gas, it is preferable for use in a fluorine-based gas atmosphere.

What is claimed is:

1. A method of forming a bonding portion, comprising the steps of:

forming a projection at a surface bonding portion of a conductive member;

forming an insulating layer on at least a surface of the conductive member, which has the projection;

removing a part of said insulating layer on the surface of the projection; and bonding a member to be bonded to the surface of the projection, from which the part of the insulating layer is removed.

2. The method of forming a bonding portion according to claim 1, wherein said conductive member is formed of aluminum or an aluminum alloy.

3. The method of forming a bonding portion according to claim 1, wherein said insulating layer is formed of $Al_2O_3$ or $AlF_3$.

4. The method of forming a bonding portion according to claim 1, wherein the height of said projection is in a range of 30 to 200 μm.

5. The method of forming a bonding portion according to claim 1, wherein the thickness of said insulating layer is in a range of 31 to 200 μm.

6. The method of forming a bonding portion according to claim 1, wherein said projection is formed at a substantially central portion of a bonding surface of the member.

7. A method of forming a bonding portion, comprising the steps of:

forming a projection on a surface of a conductive member;

forming an insulating layer on the surface of the member, the insulating layer having a thickness to cover the projection; and polishing the insulating layer and the projection so that at least the surface of the projection is exposed, and mirror-surface polishing a bonding surface of the member.

8. The method of forming a bonding portion according to claim 7, wherein said conductive member is formed of aluminum or an aluminum alloy.

9. The method of forming a bonding portion according to claim 7, wherein said insulating layer is formed of $Al_2O_3$ or $AlF_3$.

10. The method of forming a bonding portion according to claim 7, wherein the height of said projection is in a range of 30 to 200 μm.

11. The method of forming a bonding portion according to claim 7, wherein the thickness of said insulating layer is in a range of 31 to 200 μm.

12. The method of forming a bonding portion according to claim 7, wherein said projection is formed at a substantially central portion of the bonding surface of the member.

13. The method of forming a bonding portion according to claim 7, wherein the surface roughness is set at 20 μm or less at Rmax by said mirror-surface polishing.

14. A method of bonding members, thereby to make structural members of a process apparatus electrically conductive, the process apparatus processing an object to be processed in a reduced-pressure atmosphere, the method comprising the steps of:

forming a projection on a bonding portion of at least one of the members;

forming an insulating layer on bonding surfaces of the members;

removing the insulating layer on the surface of the projection; and putting out of the members to be bonded into contact with the surface of the projection exposed in the preceding step.

15. The method of bonding according to claim 14, wherein said members are formed of aluminum or an aluminum alloy.

16. The method of bonding according to claim 14, wherein said insulating layer is formed of $Al_2O_3$ or $AlF_3$.

17. The method of bonding according to claim 14, wherein the height of said projection is in a range of 30 to 200 μm.

18. The method of bonding according to claim 14, wherein the thickness of said insulating layer is in a range of 31 to 200 μm.

19. The method of bonding according to claim 14, wherein said projection is formed at a substantially central portion of the bonding surface of the member.

20. A method of bonding members, thereby to make structural members of a process apparatus electrically conductive, the process apparatus processing an object to be processed in a reduced-pressure atmosphere, the method comprising the steps of:

forming a projection on a bonding surface of each of the members;

forming an insulating layer on the bonding surface of each of the members, the insulating layer having a thickness to cover said projection;

polishing said insulating layer to a surface of the projection, polishing simultaneously the insulating layer and the projection, and mirror-surface finishing the bonding surfaces of the members; and putting the projections of the members in contact.

21. The method of bonding according to claim 20, wherein said members are formed of aluminum or an aluminum alloy.

22. The method of bonding according to claim 20, wherein said insulating layer is formed of $Al_2O_3$ or $AlF_3$.

23. The method of bonding according to claim 20, wherein the height of said projection is in a range of 30 to 200 μm.

24. The method of bonding according to claim 20, wherein the thickness of said insulating layer is in a range of 31 to 200 μm.

25. The method of bonding according to claim 20, wherein said projection is formed at a substantially central portion of the bonding portion-side surface of the member.

26. The method of bonding according to claim 20, wherein the surface roughness is set at 20 μm or less at Rmax by said mirror-surface polishing.

* * * * *